United States Patent
Ouyang et al.

(10) Patent No.: US 12,180,018 B2
(45) Date of Patent: Dec. 31, 2024

(54) ELECTRONIC DEVICE TESTING APPARATUS AND ELECTRONIC DEVICE TESTING METHOD

(71) Applicant: CHROMA ATE INC., Taoyuan (TW)

(72) Inventors: Chin-Yi Ouyang, Taoyuan (TW); Chien-Ming Chen, Taoyuan (TW)

(73) Assignee: CHROMA ATE INC., Taoyuan (TW)

(*) Notice: Subject to any disclaimer, the term of this patent is extended or adjusted under 35 U.S.C. 154(b) by 222 days.

(21) Appl. No.: 17/822,816

(22) Filed: Aug. 29, 2022

(65) Prior Publication Data

US 2023/0086266 A1  Mar. 23, 2023

Related U.S. Application Data

(60) Provisional application No. 63/245,231, filed on Sep. 17, 2021.

(51) Int. Cl.
| | |
|---|---|
| *B65G 47/90* | (2006.01) |
| *G01N 3/04* | (2006.01) |
| *G01R 31/28* | (2006.01) |
| *H01L 21/67* | (2006.01) |
| *H01L 21/673* | (2006.01) |
| *H01L 21/683* | (2006.01) |
| *H05K 13/04* | (2006.01) |

(52) U.S. Cl.
CPC .............. *B65G 47/905* (2013.01); *G01N 3/04* (2013.01); *G01R 31/2867* (2013.01); *G01R 31/2874* (2013.01); *G01R 31/2887* (2013.01); *G01R 31/2893* (2013.01); *H01L 21/67236* (2013.01); *H01L 21/67333* (2013.01); *H01L 21/6838* (2013.01); *H05K 13/0408* (2013.01)

(58) Field of Classification Search
CPC ................ G01R 31/28; G01R 31/2867; G01R 31/2874; G01R 31/2887; G01R 31/2893; B65G 47/905; G01N 3/04; G01N 3/06; G01N 3/12; G01N 2203/0044; G01N 2203/0411; H01L 21/67236; H01L 21/67333; H05K 13/0408; H05K 13/0434
USPC ..................................................... 324/757.01
See application file for complete search history.

(56) References Cited

U.S. PATENT DOCUMENTS

| 5,307,011 A * | 4/1994 | Tani ........................ B07C 5/344 |
|---|---|---|
| | | 324/757.04 |
| 2011/0254945 A1* | 10/2011 | Kikuchi ............. G01R 31/2893 |
| | | 324/750.16 |

\* cited by examiner

*Primary Examiner* — Alesa Allgood
*Assistant Examiner* — Courtney G McDonnough
(74) *Attorney, Agent, or Firm* — McClure, Qualey & Rodack, LLP

(57) ABSTRACT

The present invention relates to an electronic device testing apparatus and a testing method thereof. When the test is completed, a pressing head picks up a tested electronic device from a test socket and places the tested electronic device on an output carrier, the output carrier moves out of a test zone, and an input carrier follows immediately after the output carrier and successively moves into the test zone at the same speed; after the pressing head picks up an electronic device to be tested from the input carrier, the input carrier moves out of the test zone, and the pressing head places the electronic device to be tested in the test socket. Accordingly, in the present invention, the operation of the pressing head is simplified, and the overall test efficiency is improved.

9 Claims, 7 Drawing Sheets

ELECTRONIC DEVICE TESTING APPARATUS AND ELECTRONIC DEVICE TESTING METHOD

BACKGROUND OF THE INVENTION

Field of the Invention

The present invention relates to an electronic device testing apparatus and an electronic device testing method, in particular to a testing apparatus and a testing method for determining quality of electronic devices.

Description of the Related Art

As electronic devices having complex functions are continuously developed, test of the electronic devices becomes more complicated, and the test becomes time-consuming. Therefore, optimization of the efficiency of the testing apparatus, for example, the efficiency of the sorting and transferring process of chips to be tested and tested chips, the temperature control process, the process of handling trays or the like, becomes more and more important. In order to maximize production capacity, manufacturers of a testing apparatus make a great effort to optimize test efficiency. In addition, the large size of the existing testing apparatus is disadvantageous to the layout of the site space. Therefore, it is also very important to optimize the layout of each functional unit of the testing apparatus.

A conventional technology is disclosed in Taiwanese Patent No. 1551529 entitled "Electronic Device Operating Machine". FIG. 1 which is reproduced from FIG. 3 of Taiwanese Patent No. 1551529 is a schematic view of a conventional electronic device operating machine. As shown in the figure, one end of the operating machine is provided with a feeding device 130 and a receiving device 140. The feeding device 130 is provided for loading electronic devices to be tested, and the receiving device 140 is provided for loading tested electronic devices.

The other end of the operating machine is provided with an operating device 150 for testing electronic devices. A first transferring device 162 includes a first picking member 621 and a second picking member 622. The first picking member 621 is provided for transferring the electronic devices to be tested from the feeding device 130 to the first carrier platform 161, and the second picking member 622 is provided for transferring the tested electronic devices from the first carrier platform 161 to the receiving device 140.

The operation flow of the conventional electronic device operating machine will be described as follows. First, the first picking member 621 transfers the electronic devices to be tested from the feeding device 130 to the first carrier platform 161. The first carrier platform 161 moves into the operating device 150. After the pressing and picking device of the operating device 150 picks up the electronic devices to be tested, the first carrier platform 161 moves out of the operating device 150 and returns to the departure position so that other electronic devices to be tested are transferred to the first carrier platform 161 by the first picking member 621. On the other hand, the pressing and picking device of the operating device 150 places the electronic devices to be tested into test sockets so that the electronic devices are tested therein.

When the test is completed, the pressing and picking device of the operating device 150 picks up the tested electronic devices from the test sockets, the first carrier platform 161 moves into the operating device 150 again, the pressing and picking device of the operating device 15 places the tested electronic devices into the first carrier platform 161, and the first carrier platform 161 slightly moves so as to allow the pressing and picking device to pick up the other electronic devices to be tested. Next, the first carrier platform 161 returns to the departure position so that the second picking member 622 picks up the tested electronic devices from the first carrier platform 161, and the first picking member 621 places the electronic devices to be tested in the first carrier platform 161. At the same time, the pressing and picking device of the operating device 150 places the electronic devices to be tested into the test sockets so that the electronic devices are tested therein.

As mentioned above, in the conventional electronic device operating machine, the electronic devices to be tested and the tested electronic devices are conveyed solely by the first carrier platform 161 so that the first carrier platform 161 are moved reciprocatedly and frequently. When the system operates for a time period, the preset stop position is shifted easily, resulting in an error in the pick-and-place position. The complicated transferring process directly affects the test efficiency, prolonging a test suspending time necessary for feeding in or feeding out the electronic devices. In addition, it can be clearly seen from FIG. 1 that the conventional electronic device operating machine has an unfavorable spatial layout and too much free space, and functions thereof are simple. The capacity for loading electronic devices to be tested and tested electronic devices is obviously insufficient.

SUMMARY OF THE INVENTION

The main object of the present invention is to provide an electronic device testing apparatus and an electronic device testing method capable of shortening the test suspending time necessary for feeding in or feeding out electronic devices, thereby effectively improving the test efficiency and capable of optimizing the spatial layout and providing more functions and a greater capacity for loading electronic devices to be tested and tested electronic devices.

To achieve the above object, the present invention provides an electronic device testing apparatus, comprising a feeding zone, a test zone, a discharging zone, an input carrier, an output carrier and a pick-and-place device. The feeding zone is used for loading an electronic device to be tested; the test zone includes a pressing head and a test socket, the pressing head includes a suction nozzle for picking or placing the electronic device to be tested, and the test socket is used for accommodating and testing the electronic device to be test; the discharging zone is used for loading a tested electronic device; the input carrier is used for transferring the electronic device to be tested into the test zone; the output carrier is used for transferring the tested electronic device out of the test zone; the pick-and-place device is used for transferring the electronic device to be tested between the feeding zone and the input carrier and for transferring the tested electronic device between the output carrier and the discharging zone. After the electronic device to be tested is tested in the test zone and becomes the tested electronic device, the pressing head picks up the tested electronic device from the test socket, the output carrier moves into the test zone, the pressing head places the tested electronic device on the output carrier, the output carrier moves out of the test zone, and the input carrier follows immediately after the output carrier and successively moves into the test zone at the same speed; after the pressing head picks up the electronic device to be tested from the input carrier, the input carrier moves out of the test zone, and the pressing head places the electronic device to be tested in the test socket.

Accordingly, in the present invention, the electronic device to be tested and the tested electronic device are transferred by the input carrier and the output carrier respectively, thereby eliminating the defect of the existing apparatus that a single carrier platform is moved reciprocatedly and frequently and greatly improving the transfer efficiency. In addition, the pressing head of the present invention can operate smoothly without a break during the feed-in period and the feed-out period. Specifically, after the tested electronic device is placed into the output carrier, movement of the input carrier into the test zone is synchronous with movement of the output carrier out of the test zone. At this time, the pressing head can pick up the electronic device to be tested so that the test can be carried out immediately after the input carrier moves out of the test zone. In other words, in the present invention, the operation of the pressing head is simplified, the overall test efficiency is improved, and unnecessary transfer actions are eliminated due to use of the output carrier and the input carrier, thereby reducing energy consumption and improving the service life of the apparatus.

Preferably, the electronic device testing apparatus of the present invention may further comprise a housing and a dust-proof slide cover. The feeding zone may include a first tray, a tray conveying device, an outer area and an inner area. The inner area of the feeding zone, the test zone, the input carrier, the output carrier, the pick-and-place device and at least a part of the discharging zone may be arranged in the housing. The tray conveying device is used for transferring the first tray from the outer area to the inner area. The electronic device to be tested may be loaded on the first tray. The dust-proof slide cover can be arranged outside the housing and can be slidably moved to cover the outer area of the feeding zone or slidably moved away from the outer area. Accordingly, when the electronic device to be tested is stored in the outer area of the feeding area, the dust-proof slide cover can prevent the electronic device to be tested from contamination. The dust-proof slide cover can be slidably moved away from the outer area of the feeding zone so that the electronic device to be tested can be fed in easily.

Furthermore, the discharging zone of the electronic device testing apparatus of the present invention may include a second tray, a tray translating device, a first area, a second area and a tray knocking device. The first area may be provided in the housing; the tray translating device may be used for transferring the second tray from the first area to the second area; the tested electronic device may be loaded on the second tray; the tray knocking device may be arranged in the second area and may knock the second tray at a specific frequency. In other words, in the present invention, the second tray may be vibrated by the tray knocking device so that the tested electronic device which is not exactly positioned in an electronic device-accommodating slot can smoothly get into the slot.

To achieve the above object, the present invention provides an electronic device testing method, mainly comprising the steps of: transferring an electronic device to be tested from a feeding zone to an input carrier by a pick-and-place device; transferring the electronic device to be tested to a test zone by the input carrier, the test zone including a pressing head and a test socket; moving the input carrier out of the test zone after the electronic device to be tested is picked up from the input carrier by the pressing head; placing the electronic device to be tested into the test socket and testing the electronic device to be tested by the pressing head; picking up a tested electronic device from the test socket by the pressing head, moving an output carrier into the test zone, and placing the tested electronic device into the output carrier by the pressing head; moving the output carrier out of the test zone while the input carrier follows immediately after the output carrier and successively moves into the test zone at the same speed; and repeating the above-mentioned steps.

In other words, in the electronic device testing method provided by the present invention, after the test is completed, during a pick-and-place operation of the pressing head, the electronic device to be tested is fed in by the input carrier and the test electronic device is fed out by the output carrier. Movement of the input carrier into the test zone is synchronous with movement of the output carrier out of the test zone. Thereby, the present invention significantly shortens the idle time of the test and can greatly improve the operation efficiency of the apparatus.

DESCRIPTION OF THE PREFERRED EMBODIMENTS

Figure 1:
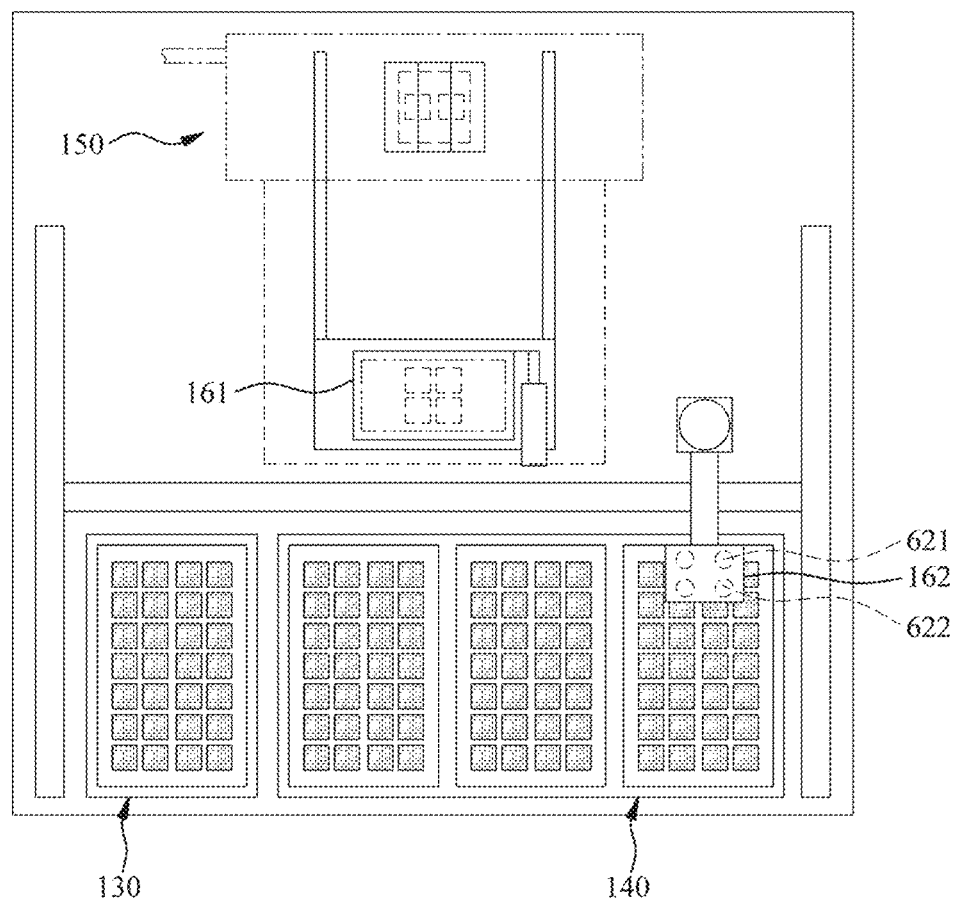
FIG. 1 is a schematic view of a conventional electronic device operating machine.

Before an electronic device testing apparatus and a testing method thereof according to the present invention are described in detail in the embodiments, it should be noted that in the following description, similar components will be designated by the same reference numerals. Furthermore, the drawings of the present invention are for illustrative purposes only, they are not necessarily drawn to scale, and not all details are necessarily shown in the drawings.

Figure 2A:
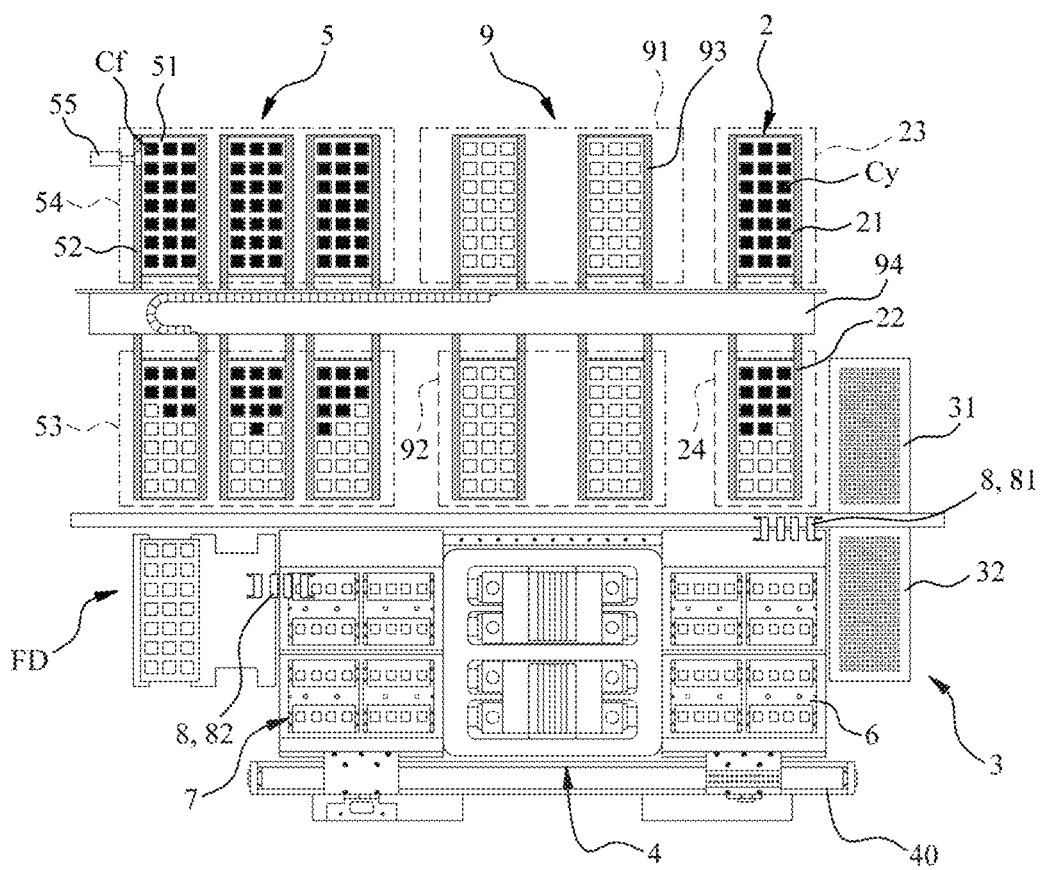
FIG. 2A is a top view of an apparatus according to a preferred embodiment of the present invention.
Figure 2B:
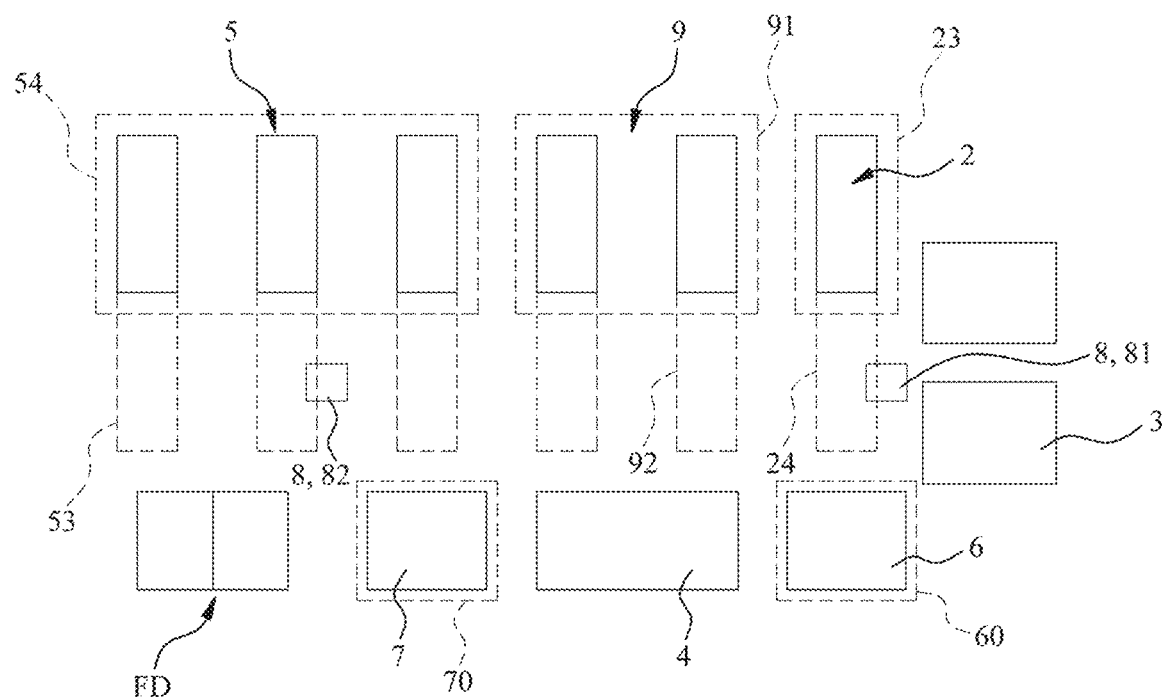
FIG. 2B is a schematic view of the apparatus according to the preferred embodiment of the present invention.

The layout of each functional unit of an apparatus of a preferred embodiment will be described in the following description by referring to FIGS. 2A and 2B. FIG. 2A is a top view of the apparatus according to the preferred embodiment of the present invention, and FIG. 2B is a schematic view of the apparatus according to the preferred embodiment of the present invention. As shown in the figures, the plane layout of the apparatus in this embodiment mainly includes: a feeding zone 2, an empty tray zone 9, a discharging zone 5, a temperature control zone 3, a feeding buffer zone 60, a test zone 4, a discharging buffer zone 70 and a tested chip buffer zone FD.

Figure 3:
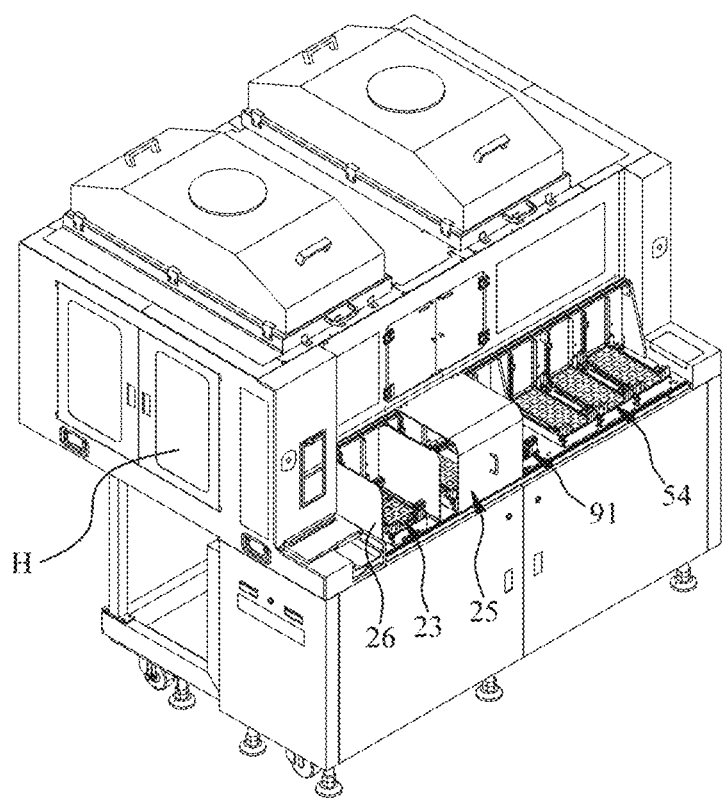
FIG. 3 is a perspective view showing the appearance of the apparatus according to the preferred embodiment of the present invention.

Reference is made to FIG. 3, which is a perspective view of the apparatus according to the preferred embodiment of the present invention. As shown in FIG. 3, the apparatus of this embodiment includes a housing H. The feeding zone 2 includes a first tray 21, a tray conveying device 22, an outer area 23 and an inner area 24. The discharging zone 5 includes a second tray 51, a tray translating device 52, a first area 53, a second area 54 and a tray knocking device 55. The empty tray zone 9 includes an empty tray storage zone 91, an empty tray buffer zone 92, an empty tray transferring device 93 and an empty tray conveying device 94.

As shown in FIG. 3, in the present embodiment, only the outer area 23 of the feeding zone 2, the second area 54 of the discharging zone 5 and the empty tray storage zone 91 of the empty tray zone 9 are provided outside the housing H for facilitating feeding in the electronic devices to be tested and feeding out the tested electronic devices and the empty trays. In this embodiment, a dust-proof slide cover 25 is arranged outside the housing H, and partitions 26 are arranged on both sides of the outer area 23 of the feeding zone 2. The dust-proof slide cover 25 is of an L-shaped form two ends of which are coupled to slide rails outside the housing H so that the dust-proof slide cover 25 can be slidably moved in a horizontal direction. When the electronic devices to be tested are to be fed in, the dust-proof slide cover 25 can be slidably moved away from the outer area 23. When the electronic devices to be tested have been fed in, the dust-proof slide cover 25 can be slidably moved back to the outer area 23. With the cooperation of the partitions 26 on both sides of the outer area 23, the outer area 23 becomes a closed space capable of preventing the electronic devices to be tested from contamination.

The tray conveying device 22 of the feeding zone 2 may be a conveyor belt for transferring the first tray 21 from the outer area 23 to the inner area 24 inside the housing H, and the first tray 21 is loaded with the electronic devices Cy to be tested. On the other hand, the empty tray transferring device 93 may be a tray gripper device for transferring an empty tray from the inner area 24 to the empty tray buffer zone 92. When all the electronic devices Cy to be tested on the first tray 21 of the inner area 24 have been taken away, the empty tray is moved from the inner area 24 to the empty tray buffer area 92 outside the housing H by the empty tray transferring device 93. On the other hand, the empty tray located in the empty tray buffer zone 92 is then transported to the empty tray storage area 91 by the empty tray conveying device 94 which may be a conveyor belt.

As to the discharging zone 5, the first area 53 is provided in the housing H, and the tray translating device 52 of this embodiment may be a conveyor belt for transferring the second tray 51 from the first area 53 to the second area 54, and the second tray 51 is used for loading the tested electronic devices Cf. As shown in the figure, the present embodiment includes three tray translating devices 52 each of which carries one second tray 51. The tested electronic devices Cf are sorted and loaded on the three second trays 51 according to with test results, such as good products, defective products and retested products.

It is inevitable that the electronic devices are not properly placed in the electronic device-accommodating slots of the second tray 51 in the process of picking and placing the electronic devices or that the electronic devices fall out of the electronic device-accommodating slots in the transfer process of the second tray 51. Accordingly, in the present embodiment, the tray knocking device 55 is specially arranged in the second area 54 and is capable of knocking the second tray 51 at a specific frequency, that is, the second tray 51 can be vibrated by the tray knocking device 55 so that the tested electronic devices which are not exactly positioned in the electronic device-accommodating slots can smoothly get into the slots. The tray knocking device 55 in this embodiment may be a small pneumatic cylinder. Of course, other equivalent devices that can generate percussion, impact or vibration at a specific frequency are applicable.

As shown in the figure, the temperature control zone 3 is arranged on one side of the feeding zone 2. Since the apparatus in this embodiment is used for a high temperature test, the temperature control zone 3 is provided as a heating zone, which includes a first preheating zone 31 and a second preheating zone 32. The first preheating zone 31 and the second preheating zone 32 can be provided as two heating zones with different temperatures, such as 120° C. and 60° C. The tested chip buffer zone FD may be used to temporarily store tested electronic devices that have to be retested or temporarily store electronic devices that have not yet been tested due to interruption of the test caused by failure of the apparatus or other reasons.

As shown in FIG. 2A and FIG. 2B, the feeding buffer zone 60, the test zone 4 and the discharging buffer zone 70 in this embodiment are arranged in a straight line along the guide rail 40, and the guide rail 40 is also coupled to the input carrier 6 and the output carrier 7. The input carrier 6 is capable of moving between the feeding buffer zone 60 and the test zone 4, and the output carrier 7 is capable of moving between the test zone 4 and the discharging buffer zone 70.

The pick-and-place device 8 as shown in the figure includes a feeding pick-and-place module 81 and a discharging pick-and-place module 82. The feeding pick-and-place module 81 is provided for transferring the electronic devices Cy to be tested among the feeding zone 2, the temperature control zone 3 and the input carrier 6. The discharging pick-and-place module 82 is provided for transferring the tested electronic devices Cf between the output carrier 7 and the discharging zone 5.

The feeding and discharging process of this embodiment will be described below. Reference is made to FIG. 2A and FIG. 2B again. After the first tray 21 is transferred from the outer area 23 to the inner area 24 inside the housing H by the tray conveying device 22, the electronic devices Cy to be tested is picked up from the first tray 21 and transferred to the temperature control zone 3 by the feeding pick-and-place module 81 so as to regulate the temperature of the electronic devices Cy to be tested. When the temperature of the electronic devices Cy to be tested reaches a specific temperature (for example, 60° C.), the feeding pick-and-place module 81 picks up the electronic devices Cy to be tested from the temperature control zone 3, transfers the electronic devices Cy to be tested to the feeding buffer zone 60 and places them on the input carrier 6.

Figure 4A:
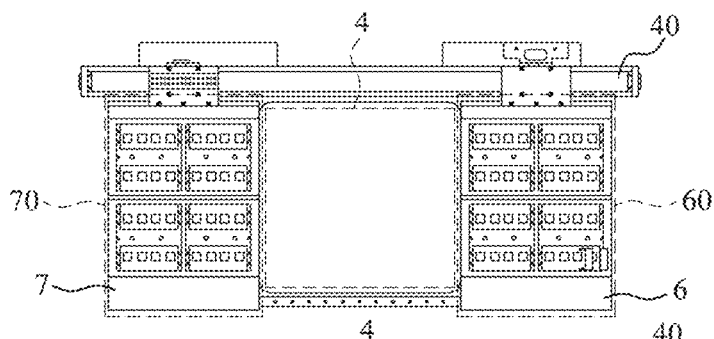
FIGS. 4A to 4E are schematic top views showing a test transfer operation according to a preferred embodiment of the present invention.
Figure 4B:
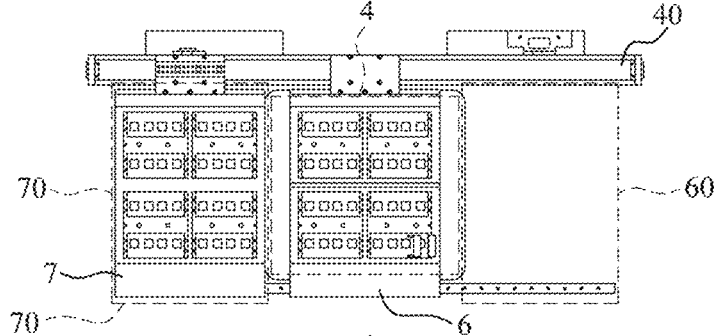
Figure 4C:
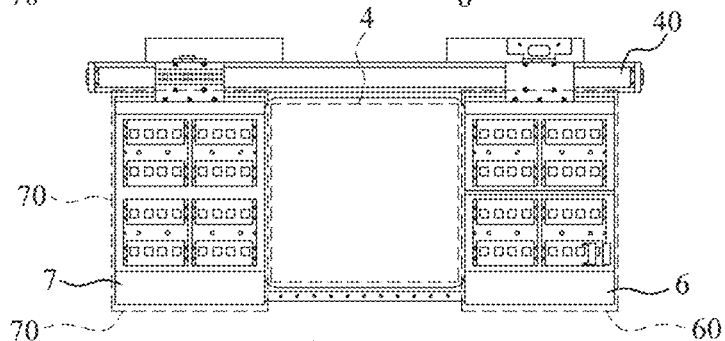
Figure 4D:
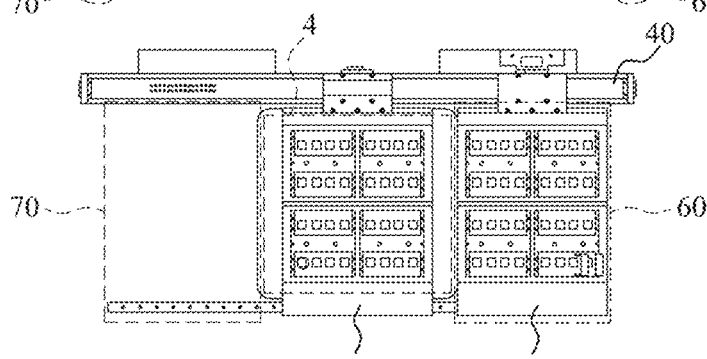

Next, the process of a test transfer operation according to a preferred embodiment will be described below. Reference is made to FIGS. 4A to 4E and FIGS. 5A to 5E. FIGS. 4A to 4E are schematic top views showing the test transfer operation of the preferred embodiment of the present invention, and FIGS. 5A to 5E are schematic front views showing the test transfer operation of the preferred embodiment of the present invention. When the input carrier 6 receives the electronic devices Cy to be tested, the input carrier 6 moves from the feeding buffer zone 60 to the test zone 4. FIG. 4A and FIG. 5A show the situation before movement of the input carrier 6 while FIG. 4B and FIG. 5B show the situation after movement of the input carrier 6. The test zone 4 of this embodiment includes a pressing head 41 and a plurality of test sockets 42. The pressing head 41 has a plurality of suction nozzles 411 and can be lifted or lowered, and the test sockets 42 can accommodate electronic devices and test the accommodated electronic devices.

Then, the pressing head 41 is lowered to pick up the electronic devices Cy to be tested with the suction nozzles 411 as shown in FIG. 4B and FIG. 5B. After the electronic devices Cy to be tested are successfully picked up, the pressing head 41 is lifted, and the input carrier 6 moves out of the test zone 4, as shown in FIG. 4C and FIG. 5C.

Figure 5A:
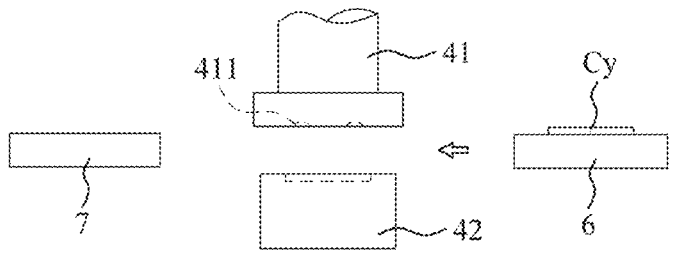
FIGS. 5A to 5E are schematic front views showing the test transfer operation according to the preferred embodiment of the present invention.
Figure 5B:
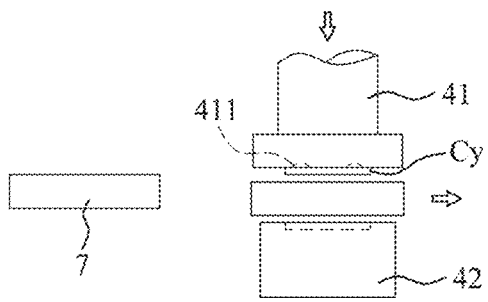
Figure 5C:
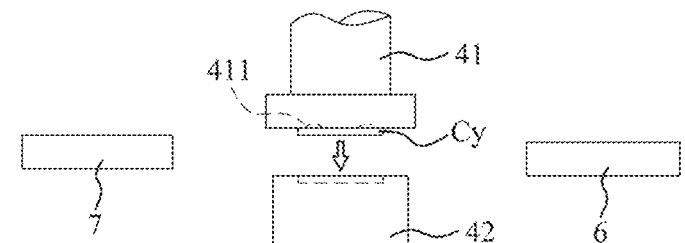
Figures 1, 5C:
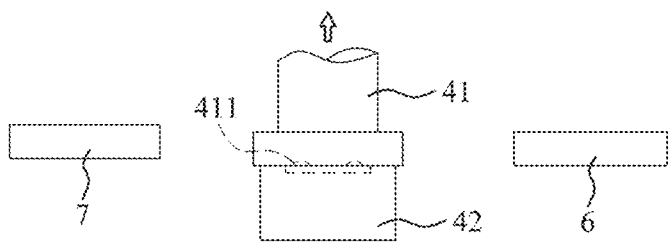

As shown in FIG. 5C-1, the pressing head 41 is lowered to place the electronic devices Cy to be tested into the test sockets 42, and the system starts to test the electronic devices Cy to be tested. During the test, the electronic devices Cy to be tested are pressed by the pressing head 41 so that the electronic devices Cy to be tested can be kept in electrical contact with the test sockets 42.

Figures 2, 5C:
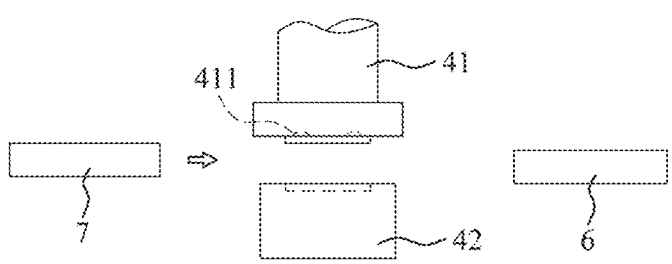
Figure 5D:
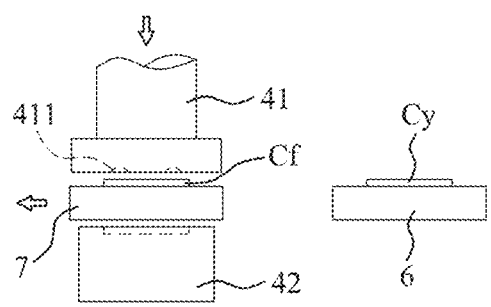

After the test is completed (i.e., the electronic devices Cy to be tested become the tested electronic devices Cf), the pressing head 41 picks up the tested electronic devices Cf from the test sockets 42 and is lifted as shown in FIG. 5C-2. Next, the output carrier 7 moves from the discharging buffer zone 70 to the test area 4, and the pressing head 41 is lowered to place the tested electronic devices Cf on the output carrier 7, as shown in FIG. 4D and FIG. 5D.

Figure 4E:
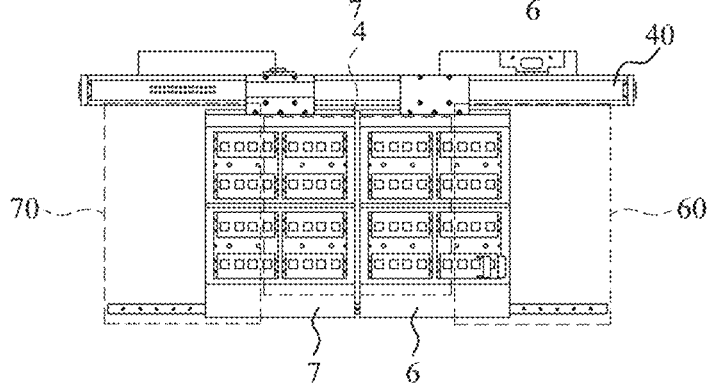
Figure 5E:
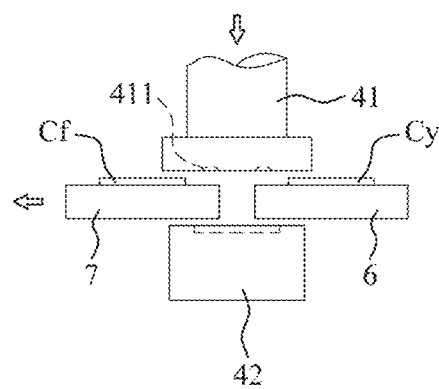

After the pressing head 41 has placed the tested electronic devices Cf on the output carrier 7 and has been lifted, the output carrier 7 moves out of the test zone 4, and the input carrier follows immediately after the output carrier and successively moves into the test zone 4 at the same speed, as shown in FIG. 4E and FIG. 5E. In other words, in this embodiment, movement of the input carrier 6 into the test zone 4 is synchronous with movement of the output carrier 7 out of the test zone 4. At this time, the pressing head 41 can pick up the electronic devices Cy to be tested as shown in FIG. 4B and FIG. 5B, and then the process as shown FIGS. 5C to 5E can be carried out in sequence.

On the other hand, after the output carrier 7 carries the tested electronic devices Cf to the discharging buffer zone 70, the tested electronic devices Cf are picked up by the discharging pick-and-place module 82 and are sorted and placed on the corresponding second tray 51 in the first area 53 of the discharging zone 5 according the test results. When the second tray 51 is fully loaded with the tested electronic devices Cf, the second tray 51 is transferred from the first area 53 to the second area 54 by the tray translating device 52. The tray knocking device 55 is enabled to knock the second tray 51 until all the tested electronic devices Cf are exactly positioned in the electronic device-accommodating slots.

The preferred embodiments of the present invention are illustrative only, and the claimed inventions are not limited to the details disclosed in the drawings and the specification. Accordingly, it is intended that it have the full scope permitted by the language of the following claims.

What is claimed is:

1. An electronic device testing apparatus, comprising:
a feeding zone, for loading at least one electronic device to be tested;
a test zone, including a pressing head and a test socket, the pressing head including a suction nozzle for picking or placing the at least one electronic device to be tested, the test socket being used for accommodating and testing the at least one electronic device to be test;
a discharging zone, for loading at least one tested electronic device;
an input carrier, for transferring the at least one electronic device to be tested into the test zone;
an output carrier, for transferring the at least one tested electronic device from the test zone;
a pick-and-place device, for transferring the at least one electronic device to be tested between the feeding zone and the input carrier, and for transferring the at least one tested electronic device between the output carrier and the discharging zone;
a housing;
an empty tray storage zone, an empty tray buffer zone, an empty tray transferring device and an empty tray conveying device;
wherein the empty tray storage zone is arranged outside the housing: the empty tray transferring device is used for transferring an empty tray from the feeding zone to the empty tray buffer zone, and the empty tray conveying device is used for transferring the empty tray from the empty tray buffer zone to the empty tray storage zone;
wherein after the at least one electronic device to be tested is tested in the test zone and becomes the at least one tested electronic device, the suction nozzle of the pressing head picks up the at least one tested electronic device from the test socket, the output carrier moves into the test zone, the suction nozzle of the pressing head places the at least one tested electronic device on the output carrier, the output carrier moves out of the test zone, and the input carrier follows immediately after the output carrier and successively moves into the test zone at the same speed; after the suction nozzle of the pressing head picks up the at least one electronic device to be tested from the input carrier, the input carrier moves out of the test zone, and the suction nozzle of the pressing head places the at least one electronic device to be tested in the test socket.

2. The electronic device testing apparatus of claim 1, wherein the feeding zone includes a first tray, a tray conveying device, an outer area and an inner area; the inner area of the feeding zone, the test zone, the input carrier, the output carrier, the pick-and-place device and at least a part of the discharging zone are arranged in the housing; the tray conveying device is used for transferring the first tray from the outer area to the inner area; the at least one electronic device to be tested is loaded on the first tray.

3. The electronic device testing apparatus of claim 2, further comprising a dust-proof slide cover, arranged outside the housing and capable of being slidably moved to cover the outer area of the feeding zone or slidably moved away from the outer area.

4. The electronic device testing apparatus of claim 2, wherein the discharging zone includes a second tray, a tray translating device, a first area, a second area and a tray knocking device, the first area is provided in the housing; the tray translating device is used for transferring the second tray from the first area to the second area; the at least one tested electronic device is loaded on the second tray; the tray knocking device is arranged in the second area and knocks the second tray at a specific frequency.

5. The electronic device testing apparatus of claim 1, further comprising a feeding buffer zone, a discharging buffer zone and a guide rail, wherein the feeding buffer zone, the test zone and the discharging buffer zone are arranged in a straight line along the guide rail; the input carrier and the output carrier are coupled to the guide rail; the input carrier moves between the feeding buffer zone and the test zone, and the output carrier moves between the test zone and the discharging buffer zone.

6. The electronic device testing apparatus of claim 1, further comprising a temperature control zone, for regulating a temperature of the at least one electronic device to be tested, wherein the pick-and-place device includes a feeding pick-and-place module and a discharging pick-and-place module; the feeding pick-and-place module is used for transferring the at least one electronic device to be tested among the feeding zone, the temperature control zone and the input carrier; and the discharging pick-and-place module is used for transferring the at least one tested electronic device between the output carrier and the discharging zone.

7. An electronic device testing method, comprising the steps of:
(A) transferring at least one electronic device to be tested from a tray in a feeding zone to an input carrier by a pick-and-place device;
(B) transferring the at least one electronic device to be tested to a test zone by the input carrier, the test zone including a pressing head and a test socket;
(C) moving the input carrier out of the test zone after the at least one electronic device to be tested is picked up from the input carrier by the pressing head;
(D) placing the at least one electronic device to be tested into the test socket and testing the at least one electronic device to be tested by the pressing head;
(E) picking up at least one tested electronic device from the test socket by the pressing head, moving an output carrier into the test zone, and placing the at least one tested electronic device into the output carrier by the pressing head;
(F) moving the output carrier out of the test zone while the input carrier follows immediately after the output carrier and successively moves into the test zone at the same speed;
(G) repeating the steps (C) to (F);
wherein in response to determining that the tray becomes an empty tray, the empty tray transferring device transfers the empty tray from the feeding zone to the empty tray buffer zone, and the empty tray conveying device transfers the empty tray from the empty tray buffer zone to the empty tray storage zone.

8. The electronic device testing method of claim 7, wherein in the step (A), the at least one electronic device to be tested is transferred from the feeding zone to a temperature control zone by the pick-and-place device, a temperature of the at least one electronic device to be tested is regulated in the temperature control zone, and then, the at least one electronic device to be tested is transferred to the input carrier by the pick-and-place device.

9. The electronic device testing method of claim 8, wherein in the step (F), after the output carrier is moved out of the test zone, the at least one tested electronic device is transferred to a second tray in a discharging zone by the pick-and-place device, wherein the discharging zone is provided with a tray knocking device, which knocks the second tray at a specific frequency.

* * * * *